United States Patent
Wiener et al.

(10) Patent No.: US 12,189,312 B2
(45) Date of Patent: Jan. 7, 2025

(54) RETICLE GRIPPER DAMPER AND ISOLATION SYSTEM FOR LITHOGRAPHIC APPARATUSES

(71) Applicants: ASML Holding N.V., Veldhoven (NL); ASML Netherlands B.V., Veldhoven (NL)

(72) Inventors: Roberto B. Wiener, Ridgefield, CT (US); Peter Conrad Kochersperger, Easton, CT (US); Boris Kogan, Norwalk, CT (US); Martinus Agnes Willem Cuijpers, Veldhoven (NL); Robert Jeffrey Wade, Stamford, CT (US); Shaun Evans, Danbury, CT (US)

(73) Assignees: ASML Holding N.V., Veldhoven (NL); ASML Netherlands B.V., Veldhoven (NL)

(*) Notice: Subject to any disclaimer, the term of this patent is extended or adjusted under 35 U.S.C. 154(b) by 198 days.

(21) Appl. No.: 17/799,652

(22) PCT Filed: Jan. 26, 2021

(86) PCT No.: PCT/EP2021/051758
§ 371 (c)(1),
(2) Date: Aug. 12, 2022

(87) PCT Pub. No.: WO2021/160423
PCT Pub. Date: Aug. 19, 2021

(65) Prior Publication Data
US 2023/0075162 A1     Mar. 9, 2023

Related U.S. Application Data

(60) Provisional application No. 62/976,553, filed on Feb. 14, 2020.

(51) Int. Cl.
*G03F 7/00*     (2006.01)
*H01L 21/687*   (2006.01)

(52) U.S. Cl.
CPC .......... *G03F 7/709* (2013.01); *G03F 7/70741* (2013.01); *H01L 21/68707* (2013.01)

(58) Field of Classification Search
CPC ... G03F 7/70733; G03F 7/70741; G03F 7/709
See application file for complete search history.

(56) References Cited

U.S. PATENT DOCUMENTS

| | | | |
|---|---|---|---|
| 11,092,903 B2 | 8/2021 | Kanehara | |
| 2003/0098963 A1* | 5/2003 | Phillips | G03B 27/60 355/73 |

(Continued)

FOREIGN PATENT DOCUMENTS

| | | |
|---|---|---|
| EP | 1 465 011 A1 | 10/2004 |
| EP | 1 500 985 A2 | 1/2005 |

(Continued)

OTHER PUBLICATIONS

International Search Report and Written Opinion of the International Searching Authority directed to related International Patent Application No. PCT/EP2021/051758, mailed Apr. 20, 2021; 12 pages.

(Continued)

*Primary Examiner* — Steven H Whitesell
(74) *Attorney, Agent, or Firm* — Sterne, Kessler, Goldstein & Fox P.L.L.C.

(57) ABSTRACT

Embodiments herein describe methods, devices, and systems for a reticle gripper damper and isolation system for handling reticles and reducing vibrations in a reticle handler for lithography apparatuses and systems. A reticle handler apparatus includes a reticle handler arm, a reticle baseplate configured to hold the reticle, and a gripper arranged to connect the reticle baseplate to the reticle handler arm. The gripper includes a static structure that is coupled to the reticle handler arm, an isolation structure that is coupled to the static structure, and one or more damping elements. The (Continued)

gripper is configured to reduce vibrations of the reticle in the reticle handler apparatus using the one or more damping elements.

20 Claims, 9 Drawing Sheets

(56) References Cited

U.S. PATENT DOCUMENTS

| | | | | |
|---|---|---|---|---|
| 2012/0092640 A1* | 4/2012 | Johnson | ............... | G03F 7/70916 |
| | | | | 355/72 |
| 2015/0251323 A1* | 9/2015 | Kim | ..................... | B25J 19/0091 |
| | | | | 294/213 |
| 2017/0173799 A1* | 6/2017 | LoPiccolo | ......... | H01L 21/68792 |

FOREIGN PATENT DOCUMENTS

| | | |
|---|---|---|
| TW | 201835687 A | 10/2018 |
| WO | WO 2010/115657 A1 | 10/2010 |

OTHER PUBLICATIONS

International Preliminary Report on Patentability directed to related International Patent Application No. PCT/EP2021/051758, issued Aug. 11, 2022; 9 pages.
Ebrahimi et al., "A novel eddy current damper: theory and experiment," Journal of Physics D: Applied Physics, vol. 42, No. 7, Mar. 12, 2009; pp. 1-6.
Taiwanese Office Action directed to Taiwanese Patent Application No. 110104380, mailed Aug. 26, 2024; 16 pages.

* cited by examiner

RETICLE GRIPPER DAMPER AND ISOLATION SYSTEM FOR LITHOGRAPHIC APPARATUSES

CROSS-REFERENCE TO RELATED APPLICATIONS

This application claims priority of U.S. Provisional Patent Application No. 62/976,553, which was filed on Feb. 14, 2020, and which is incorporated herein in its entirety by reference.

FIELD

The present disclosure relates to a reticle gripper damper and isolation system for handling reticles and reducing vibrations in a reticle handler for lithography apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features, which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Reticles are critical and sensitive components for imparting patterns on substrates. A reticle handler may be used to move and position multiple reticles for scanning and/or patterning operations in a lithographic apparatus. Input disturbances in the reticle handler may put the reticle at risk of slipping and generating particles, which may end up on the reticle front-side or back side, causing defects on every die. Furthermore, increased vibrations may lead to blurring and failure of imaging sensors, which are utilized for reticle pre-alignment and particle detection.

SUMMARY

Accordingly, the present disclosure provides methods, devices, and systems for passive isolation and damping in a reticle handler in order to reduce vibrations and improve performance in a lithographic apparatus.

In some embodiments, a reticle handler apparatus for positioning of a reticle is disclosed. The reticle handler apparatus includes a reticle handler arm, a reticle baseplate configured to hold the reticle, and a gripper arranged to connect the reticle baseplate to the reticle handler arm. The gripper includes a static structure that is coupled to the reticle handler arm, an isolation structure that is coupled to the static structure, and one or more damping elements. The gripper is configured to reduce vibrations of the reticle in the reticle handler apparatus using the one or more damping elements.

In some embodiments, a lithographic apparatus includes an illumination system, a support structure, a projection system, and a reticle handler apparatus. The illumination system is configured to condition a radiation beam. The support structure is constructed to support a patterning device, the patterning device being capable of imparting the radiation beam with a pattern in its cross-section to form a patterned radiation beam. The projection system is configured to project the patterned radiation beam onto a target portion of a substrate. The reticle handler apparatus is configured to handle and position the patterning device. The reticle handler apparatus includes a reticle handler arm, a reticle baseplate configured to hold the patterning device, and a gripper arranged to connect the reticle baseplate to the reticle handler arm. The gripper includes a static structure that is coupled to the reticle handler arm, an isolation structure that is coupled to the static structure, and one or more damping elements. The gripper is configured to reduce vibrations of the patterning device in the reticle handler apparatus using the one or more damping elements.

In some embodiments, a method of reducing vibrations in a reticle handler apparatus is disclosed. The method includes using a reticle handler apparatus, the reticle handler apparatus comprising a reticle handler arm, a reticle baseplate configured to hold a reticle, and a gripper comprising a static structure, an isolation structure, and one or more damping elements, and attenuating vibrations in the reticle handler apparatus using the one or more damping elements in the gripper.

Further features of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure. Embodiments of the present disclosure will now be described, by way of example only, with reference to the accompanying schematic drawings, in which.

Figure 1:
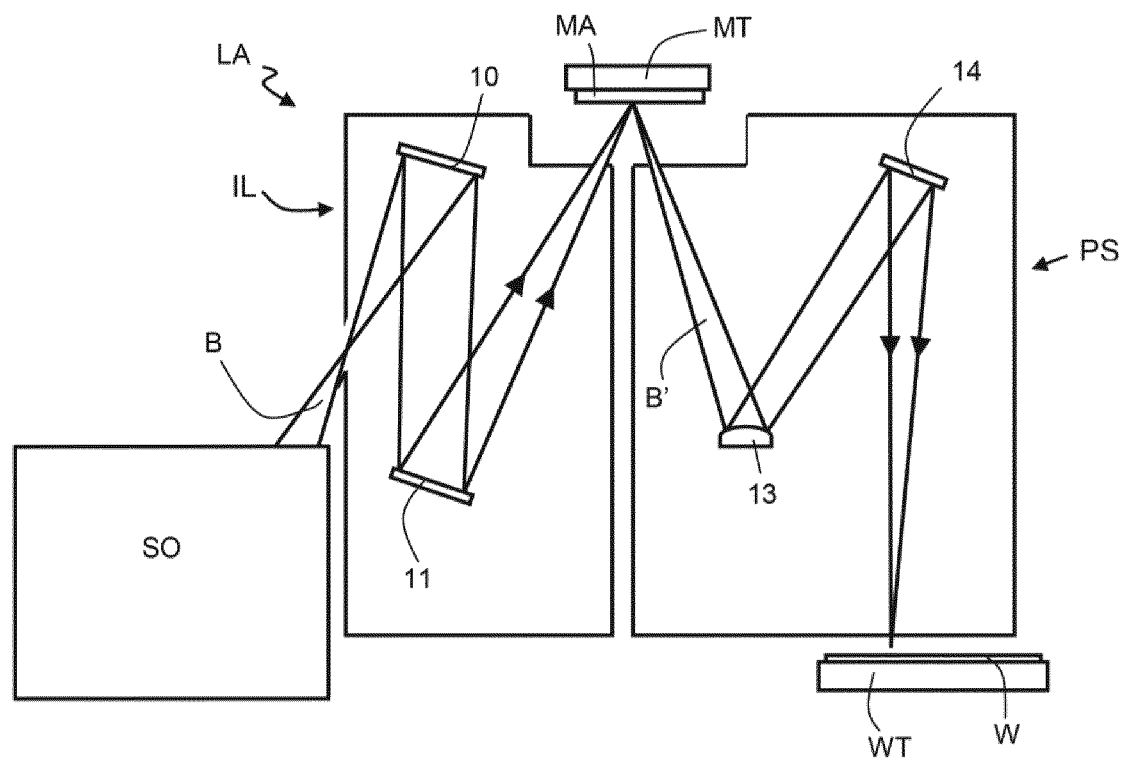
FIG. 1 shows a schematic illustration of a lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc., and in doing that may cause actuators or other devices to interact with the physical world.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL can include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL can include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS can comprise a plurality of mirrors 13, 14 that are configured to project the patterned EUV radiation beam B' onto the substrate W held by the substrate table WT. The projection system PS can apply a reduction factor to the patterned EUV radiation beam B', thus forming an image with features that are smaller than corresponding features on the patterning device MA. For example, a reduction factor of 4 or 8 can be applied. Although the projection system PS is illustrated as having only two mirrors 13, 14 in FIG. 1, the projection system PS can include a different number of mirrors (e.g. six or eight mirrors).

The substrate W can include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, can be provided in the radiation source SO, in the illumination system IL, and/or in the projection system PS.

The radiation source SO can be a laser produced plasma (LPP) source, a discharge produced plasma (DPP) source, a hydrogen plasma source, a free electron laser (FEL), or any other radiation source that is capable of generating EUV radiation.

Exemplary Reticle Stage

Figure 2:
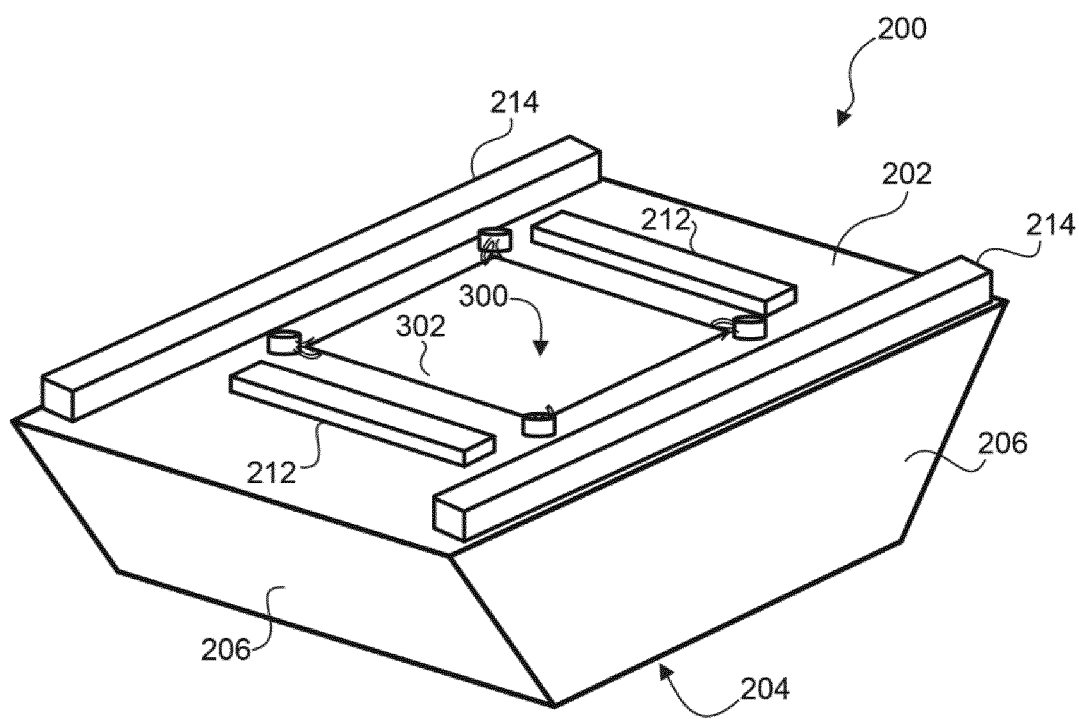
FIG. 2 shows a perspective schematic illustration of a reticle stage, according to some embodiments.
Figure 3:
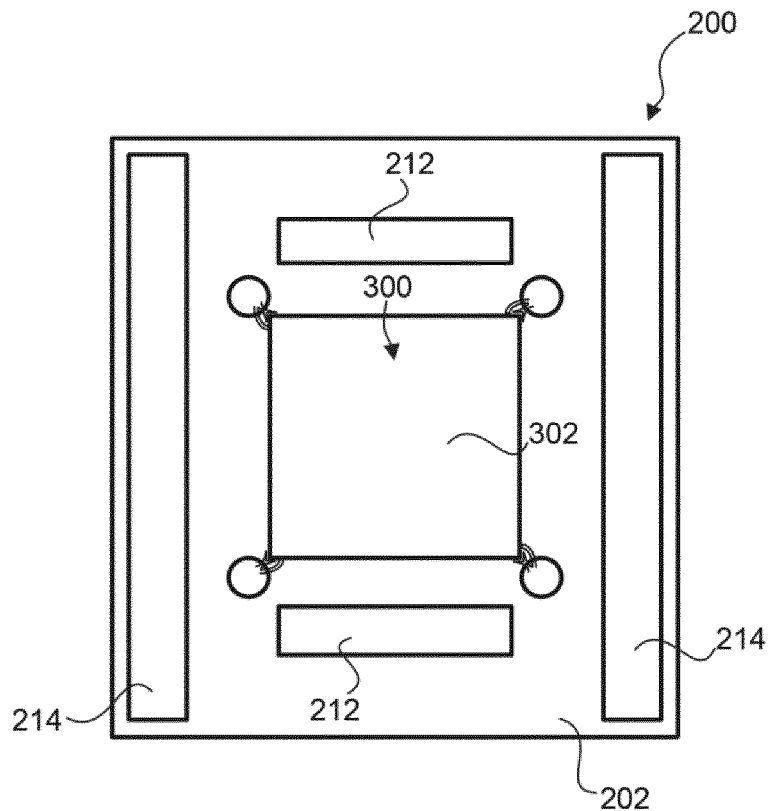
FIG. 3 shows a top plan view of the reticle stage of FIG. 2.

FIGS. 2 and 3 show schematic illustrations of an exemplary reticle stage 200, according to some embodiments. Reticle stage 200 can include top stage surface 202, bottom stage surface 204, side stage surfaces 206, and clamp 300. In some embodiments, reticle stage 200 with clamp 300 can be implemented in lithographic apparatus LA. For example, reticle stage 200 can be support structure MT in lithographic apparatus LA. In some embodiments, clamp 300 can be disposed on top stage surface 202. For example, as shown in FIG. 2, clamp 300 can be disposed at a center of top stage surface 202 with clamp frontside 302 facing perpendicularly away from top stage surface 202.

In some lithographic apparatuses, for example, lithographic apparatus LA, a reticle stage 200 with a clamp 300 can be used to hold and position a reticle 408 for scanning or patterning operations. In one example, the reticle stage 200 can require powerful drives, large balance masses, and heavy frames to support it. In one example, the reticle stage 200 can have a large inertia and can weigh over 500 kg to propel and position a reticle 408 weighing about 0.5 kg. To accomplish reciprocating motions of the reticle 408, which are typically found in lithographic scanning or patterning operations, accelerating and decelerating forces can be provided by linear motors that drive the reticle stage 200.

In some embodiments, as shown in FIGS. 2 and 3, reticle stage 200 can include first encoder 212 and second encoder 214 for positioning operations. For example, first and second encoders 212, 214 can be interferometers. First encoder 212 can be attached along a first direction, for example, a transverse direction (i.e., X-direction) of reticle stage 200. And second encoder 214 can be attached along a second direction, for example, a longitudinal direction (i.e., Y-direction) of reticle stage 200. In some embodiments, as shown in FIGS. 2 and 3, first encoder 212 can be orthogonal to second encoder 214.

As shown in FIGS. 2 and 3, reticle stage 200 can include clamp 300. Clamp 300 is configured to hold reticle 408 in a fixed plane on reticle stage 200. Clamp 300 includes clamp frontside 302 and can be disposed on top stage surface 202. In some embodiments, clamp 300 can use mechanical, vacuum, electrostatic, or other suitable clamping techniques to hold and secure an object. In some embodiments, clamp 300 can be an electrostatic clamp, which can be configured to electrostatically clamp (i.e., hold) an object, for example, reticle 408 in a vacuum environment. Due to the requirement for EUV radiation to perform in a vacuum environment, vacuum clamps cannot be used to clamp a mask or reticle and instead electrostatic clamps can be used. For example, clamp 300 can include an electrode, a resistive layer on the electrode, a dielectric layer on the resistive layer, and burls projecting from the dielectric layer. In use, a voltage can be applied to clamp 300, for example, several kV. And current can flow through the resistive layer, such that the voltage at an upper surface of the resistive layer will substantially be the same as the voltage of the electrode and generate an electric field. Also, a Coulomb force, attractive force between electrically opposite charged particles, will attract an object to clamp 300 and hold the object in place. In some embodiments, clamp 300 can be a rigid material, for example, a metal, a dielectric, a ceramic, or a combination thereof.

Exemplary Reticle Exchange Apparatus

Figure 4:
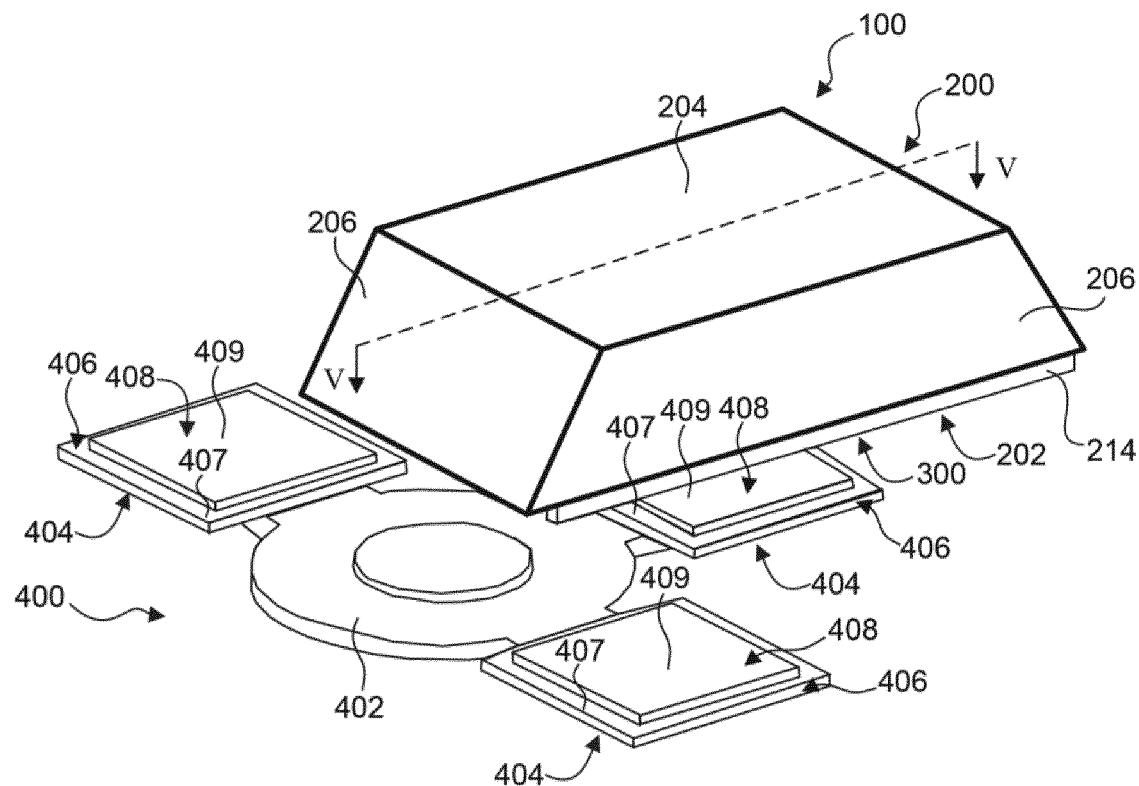
FIG. 4 shows a perspective schematic illustration of a reticle exchange apparatus, according to some embodiments.
Figure 5:
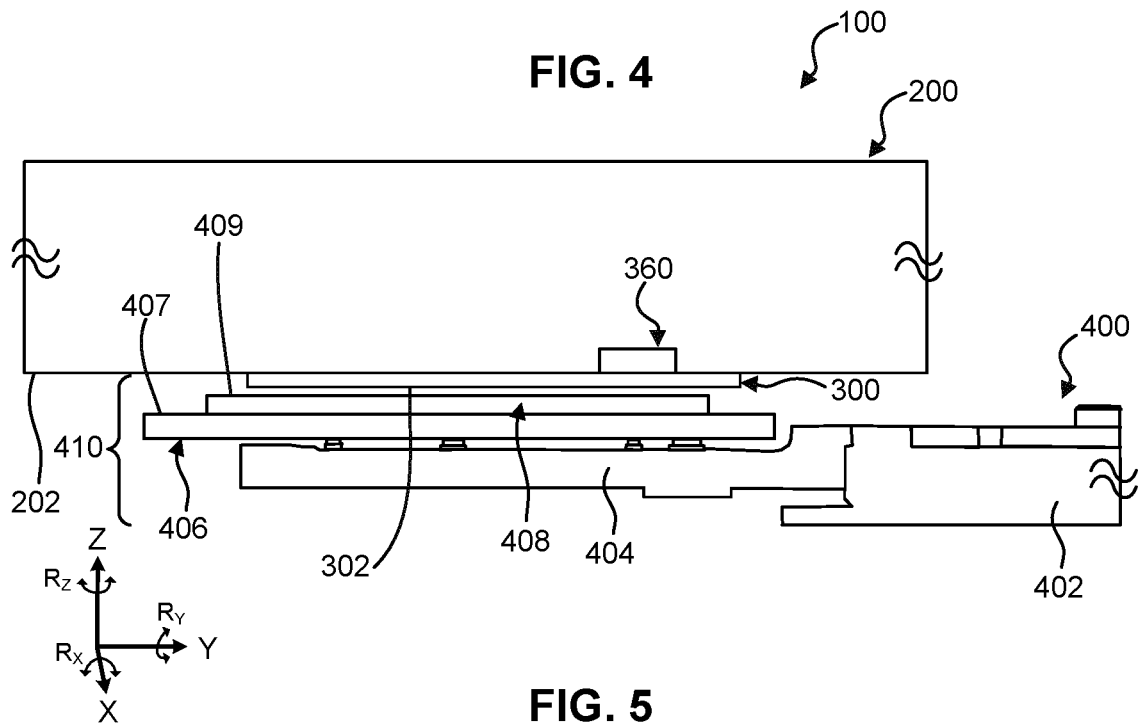
FIG. 5 shows a partial cross-sectional view of the reticle exchange apparatus of FIG. 4.

FIGS. 4 through 6 show schematic illustrations of an exemplary reticle exchange apparatus 100, according to some embodiments. Reticle exchange apparatus 100 can be configured to minimize reticle exchange time, particle generation, and contact forces or stresses from clamp 300 and/or reticle 408 to reduce damage to clamp 300 and reticle 408 and increase overall throughput in a reticle exchange process, for example, in a lithographic apparatus LA.

As shown in FIGS. 4 and 5, reticle exchange apparatus 100 can include reticle stage 200, clamp 300, and in-vacuum robot 400. In-vacuum robot 400 can include reticle handler 402.

In some embodiments, reticle handler 402 can be a rapid exchange device (RED), which is configured to efficiently rotate and minimize reticle exchange time. For example, reticle handler 402 can save time by moving multiple reticles from one position to another substantially simultaneously, instead of serially.

In some embodiments, as shown in FIG. 4, reticle handler 402 can include one or more reticle handler arms 404. In some embodiments, reticle handler arms 404 may be referred to herein as rapid exchange device (RED) grippers. Reticle handler arm 404 can include reticle baseplate 406. Reticle baseplate 406 can be configured to hold an object, for example, reticle 408. In some embodiments, reticle baseplate 406 may be referred to herein as a reticle base frame.

In some embodiments, reticle baseplate 406 can be an extreme ultraviolet inner pod (EIP) for a reticle. In some embodiments, reticle baseplate 406 includes reticle baseplate frontside 407, and reticle 408 includes reticle backside 409.

In some embodiments, as shown in FIGS. 4 and 5, reticle baseplate 406 can hold reticle 408 such that reticle baseplate frontside 407 and reticle backside 409 each face top stage surface 202 and clamp frontside 302. For example, reticle baseplate frontside 407 and reticle backside 409 can be facing perpendicularly away from top stage surface 202 and clamp frontside 302.

As shown in FIG. 5, reticle exchange apparatus 100 can include reticle exchange area 410, which is the cross-sectional area between clamp 300, reticle 408, reticle baseplate 406, and reticle handler arm 404 during a reticle exchange process.

In some embodiments, as shown in FIG. 4, reticle handler arms 404 can be arranged symmetrically about reticle handler 402. For example, reticle handler arms 404 can be spaced from each other by about 90 degrees, 120 degrees, or 180 degrees. In some embodiments, reticle handler arms 404 can be arranged asymmetrically about reticle handler 402. For example, two reticle handler arms 404 can be spaced from each other by about 135 degrees, while another two reticle handler arms 404 can be spaced from each other by about 90 degrees.

In one example, during a reticle exchange process, reticle handler arm 404 of reticle handler 402 positions reticle 408 on reticle baseplate 406 towards clamp 300 in reticle exchange area 410. As described above, a reticle handoff from reticle handler 402 to clamp 300 includes an unknown reticle position offset, which includes a reticle vertical distance offset (i.e., Z-direction offset) and a reticle tilt offset (i.e., $R_X$ offset and $R_Y$ offset). Tilt or excessive non-alignment between clamp 300 and reticle 408 can be a source of particle generation and can damage reticle 408 or clamp 300 over time. Reticle backside 409 and clamp frontside 302 should be in coplanar alignment for a final handoff. Despite calibration, variations still exist due to reticle mechanical and positioning tolerances, which can lead to high corner impacts and unpredictable first contact points between clamp 300 and reticle 408.

In one example, the reticle exchange process can involve lowering reticle stage 200 with clamp 300, which starts far away from reticle handler 402, as close to reticle 408 as possible until clamp 300 contacts reticle 408 to account for all possible offsets and/or tilts. During a reticle exchange process, reticle stage 200 with clamp 300 can be adjusted in a multi-stage movement.

Figure 6A:
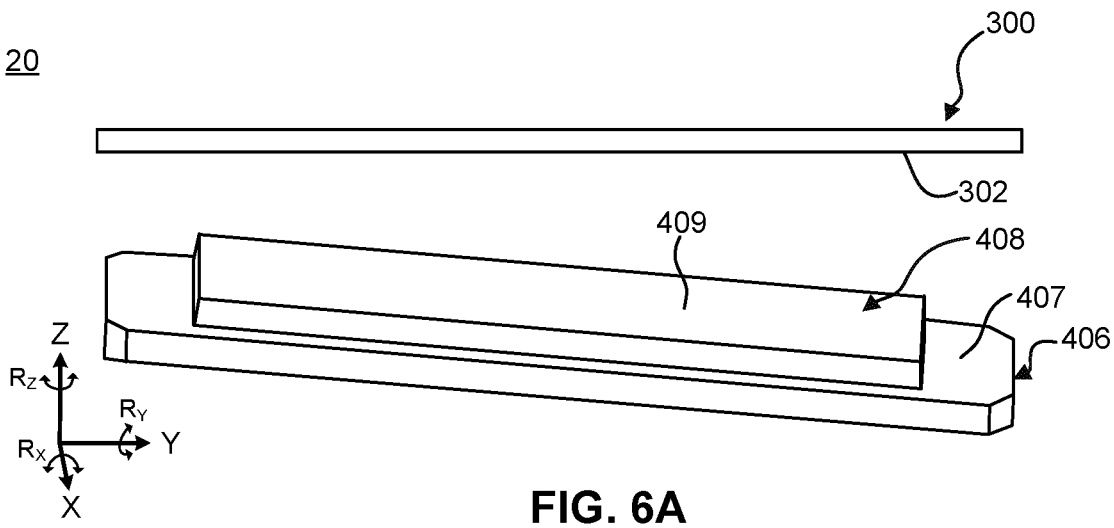
FIG. 6A shows a partial schematic illustration of a reticle exchange apparatus in an approach configuration, according to some embodiments.
Figure 6B:
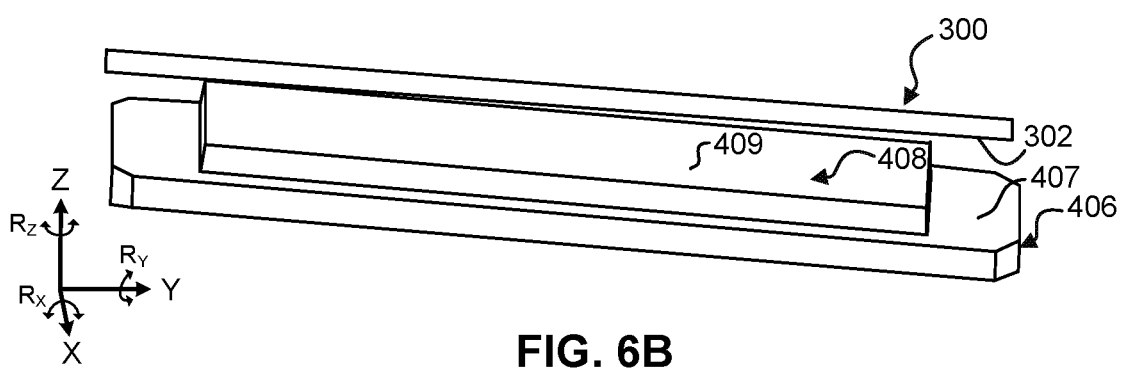
FIG. 6B shows a partial schematic illustration of a reticle exchange apparatus in a first contact configuration, according to some embodiments.
Figure 6C:
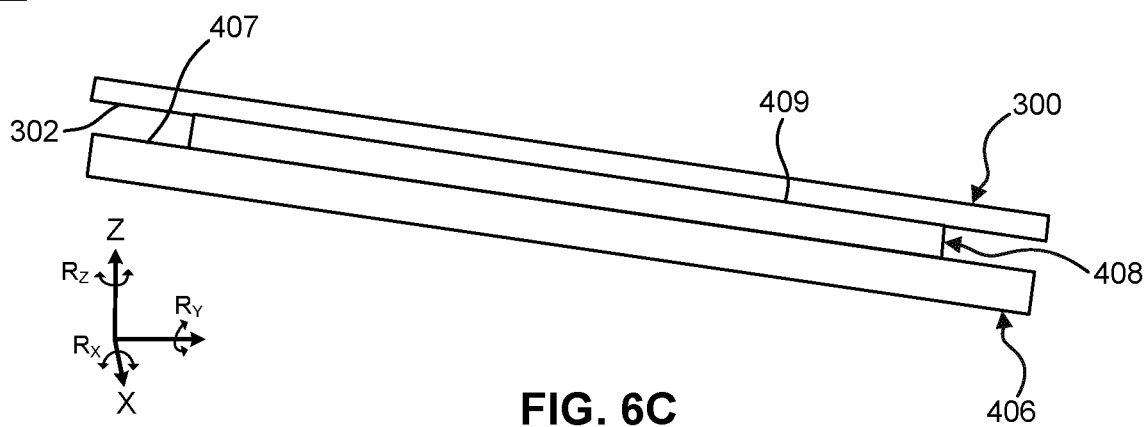
FIG. 6C shows a partial schematic illustration of a reticle exchange apparatus in a full contact configuration, according to some embodiments.

FIGS. 6A, 6B, and 6C show a partial schematic illustration of a reticle exchange apparatus in an approach configuration, first contact configuration, and full contact configuration, respectively, according to some embodiments.

As shown in FIGS. 6A through 6C, reticle exchange apparatus 100 can include clamp 300, reticle 408, and reticle baseplate 406. The multi-stage movement can occur in four stages: (1) approach; (2) first contact; (3) full contact; and (4) voltage applied to clamp.

In FIG. 6A, reticle exchange apparatus 100 can be in an approach configuration 20. Clamp 300 can be adjusted in a substantially vertical direction (i.e., Z-direction) toward reticle backside 409. In approach configuration 20, clamp 300 is turned off (i.e., no applied voltage) and reticle handler 402 deactivates the vertical direction (i.e., Z-direction) and tilt (i.e., $R_X$ and $R_Y$, rotation about X-direction and rotation about Y-direction, respectively) servo motors (not shown) of reticle handler arm 404 in reticle exchange area 410.

In FIG. 6B, reticle exchange apparatus 100 can be in a first contact configuration 30. Clamp 300 can be adjusted in a substantially vertical direction (i.e., Z-direction) toward reticle backside 409 until clamp 300 makes contact with reticle backside 409. In first contact configuration 30, clamp 300 is turned off and clamp 300 makes contact with reticle backside 409, for example, a corner of reticle 408, and then rotates or tilts about the contact (i.e., $R_X$ and $R_Y$).

In FIG. 6C, reticle exchange apparatus 100 can be in a full contact configuration 40. Clamp 300 can be rotationally adjusted about the contact (i.e., $R_X$ and $R_Y$) toward reticle backside 409 until clamp 300 makes full contact with reticle backside 409. In full contact configuration 40, clamp 300 is turned off and clamp 300 makes full contact with reticle backside 409, for example, all four corners of reticle 408, and is coplanar with reticle backside 409.

In some embodiments, in full contact configuration 40, clamp 300 makes contact with all four corners of reticle 408 and continues to move in a substantially vertical direction (i.e., Z-direction) until a mechanical force of at least 5 N is achieved.

In one aspect, with clamp frontside 302 and reticle backside 409 aligned and coplanar, clamp 300 is turned on (i.e., a voltage is applied to clamp 300) and reticle 408 is held in a fixed plane on clamp 300.

In some embodiments, as shown in FIG. 5, reticle exchange apparatus 100 can include clamp controller 360. Clamp controller 360 can be coupled to clamp 300 and be configured to control a position of clamp 300. For example, clamp controller 360 can be configured to control reticle stage 200 to allow compliant movement of clamp 300.

In some embodiments, clamp controller 360 can be coupled to servo motors or servo actuators (i.e., X-direction, Y-direction, Z-direction, $R_X$, $R_Y$, $R_Z$) of reticle stage 200 and/or clamp 300. For example, clamp controller 360 can control translations of reticle stage 200 with clamp 300 along an x-axis, y-axis, and z-axis (i.e., X-direction, Y-direction, Z-direction) and rotations about the x-axis, y-axis, and z-axis (i.e., $R_X$, $R_Y$, $R_Z$), where the x-axis, y-axis, and z-axis are orthogonal coordinates.

Exemplary Reticle Gripper Apparatuses

A reticle is a critical and sensitive component for imparting patterns on a substrate. Components in a reticle handler may be subject to input disturbances that may result in slippage of the reticle and/or failure to meet reticle positioning requirements for scanning or patterning operations. This may result in particle generation and contamination of the reticle, potential reticle/clamp damage, and/or blurring of imaging sensors. Thus, it may be desirable to reduce input disturbances (e.g., vibrations) to the reticle handler in lithographic apparatuses and systems, in order to improve throughput and performance.

In some embodiments, various dampers such as tune mass dampers, active dampers, and/or seismic dampers are utilized to reduce the impact of external and self-generated vibrations in lithographic apparatuses.

In some embodiments, tune mass dampers may be used to reduce the effect of a particular structural mode. Tune mass dampers may be unidirectional. Thus, custom designed dampers may be desirable per degree of freedom of interest and vibration mode of interest. In some embodiments, a tune mass damper may be used to attenuate the effect of vibrations in two orthogonal directions with decreased efficiency, such as by placing the tune mass damper at 45° from two degrees of freedom (DOF). Tune mass dampers may be tuned to specific frequencies and robust in fixed resonance configurations (e.g., in parallel robots in a reticle exchange device) and less robust in non-fixed resonance configurations (e.g., in serial robots such as out-of-vacuum robots (OVR) and in-vacuum robots (IVR)).

In some embodiments, active dampers may be utilized to reduce the effect of several structural vibration modes. Active dampers may require power and, in some cases, an external measurement of the excitation. In some embodiments, active dampers may be configured to attenuate one degree of freedom, but as described above with tune mass dampers, active dampers may be used to attenuate two degrees of freedom simultaneously.

In some embodiments, seismic dampers may be used to attenuate a broad spectrum with less efficiency than tune mass dampers. Seismic dampers may attenuate 2 or more degrees of freedom depending on the configuration. Other embodiments include structural damping, which adds damping elements to a structure, and module isolation, in which a complete module is isolated to mitigate input disturbances.

In some aspects, module isolation approaches may be complex and may necessitate the module being balanced for retaining a center of gravity. However, making sure the center of gravity is retained in the same place may be challenging, particularly for robots in which the center of gravity changes during robot operation. Active isolation approaches may also allow for accurate measurements of input vibrations, as well as additional active components (such as wires, sensors, and the like), which may add extra complexity to the system. Tune mass dampers might also not be robust for robots at all positions due to changes in the center of gravity. Furthermore, other damping strategies may be difficult to implement as result of volume and performance constraints in the system.

Thus, the present disclosure introduces passive isolation and damping utilizing the mass of the reticle and reticle baseplate (e.g., EIP) to create an isolated structure to mitigate external, structural and self-generated vibrations to the reticle (e.g., directly at the point of interest) and thus avoiding contamination or reticle damage issues.

In some embodiments, damping may be used to maintain the displacement of the reticle due to internal and external accelerations within specifications even though the reticle is mounted on a soft structure. In some embodiments, damping may be optimized by introducing eddy current dampers and/or viscoelastic materials (e.g., Viton, synthetic rubbers, fluoropolymer elastomers, and/or the like) that are configured to compensate and eliminate any creep effects. In some embodiments, selection of the damping method (e.g., viscoelastic material, eddy current dampers, or the like) and use of flexures, airbearings, and/or springs may be a function of the isolation specifications, load, and positioning tolerances.

In some embodiments, the reticle gripper damper and isolation system provide a compact and passive solution, in which the system may be implemented in a small volume without additional cooling, power, or other servo control-related feature for implementation. In some embodiments, the system is flexible for meeting conflicting constraints, such as providing isolation and positioning simultaneously. The system also allows for vibration attenuation in up to three perpendicular directions, which might not be feasible by using a different approach (e.g., using tune mass dampers and active isolation approaches).

Figure 7:
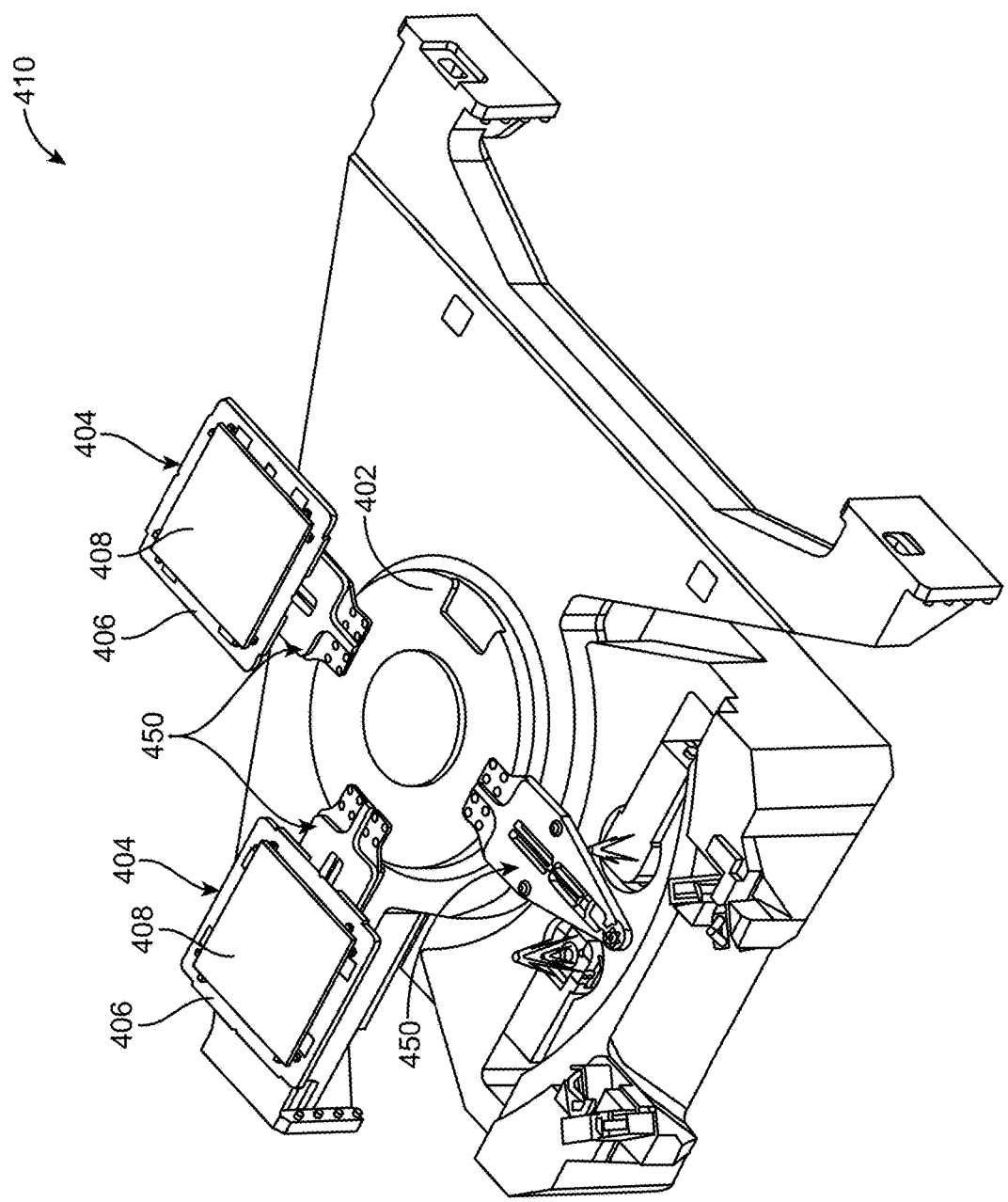
FIG. 7 shows a schematic illustration of a reticle gripper in a reticle exchange area, according to some embodiments.

FIG. 7 shows a schematic illustration of a reticle gripper 450 in reticle exchange area 410, according to some embodiments. Reticle exchange area 410 includes reticle handler 402 with two reticle handler arms 404, in which each reticle handler arm 404 includes a reticle baseplate 406 that is configured to hold a reticle 408. Although only two reticle handler arms 404 are shown in FIG. 7, it should be appreciated that any number of reticle handler arms 404 may be used in reticle handler 402. Each reticle handler arm 404 also includes reticle gripper 450, which may be arranged between reticle handler 402 and the reticle baseplate 406. In some embodiments, the reticle handler arm 404, reticle baseplate 406, and reticle gripper 405 may be referred to as an end effector.

In some embodiments, reticle gripper 450 may be utilized to provide passive isolation and damping to attenuate any induced motions or vibrations occurring during reticle exchange and/or reticle handling operations, as further discussed below with reference to FIGS. 8A-10. In some embodiments, reticle gripper 450 may be attached to reticle handler 402 and reticle baseplate 406 using pins, screws, bolts, and/or fasteners. Although FIG. 7 shows reticle gripper 450 in a particular configuration, it should be appreciated that reticle gripper 450 may be designed with any number of flexures, pins, and springs.

FIGS. 8A-8D show schematic illustrations of components of reticle gripper 450, according to some embodiments. In some embodiments, FIGS. 8A-8D show components of reticle gripper 450 disassembled and disconnected from reticle handler 502 for illustrative purposes.

Figure 8A:
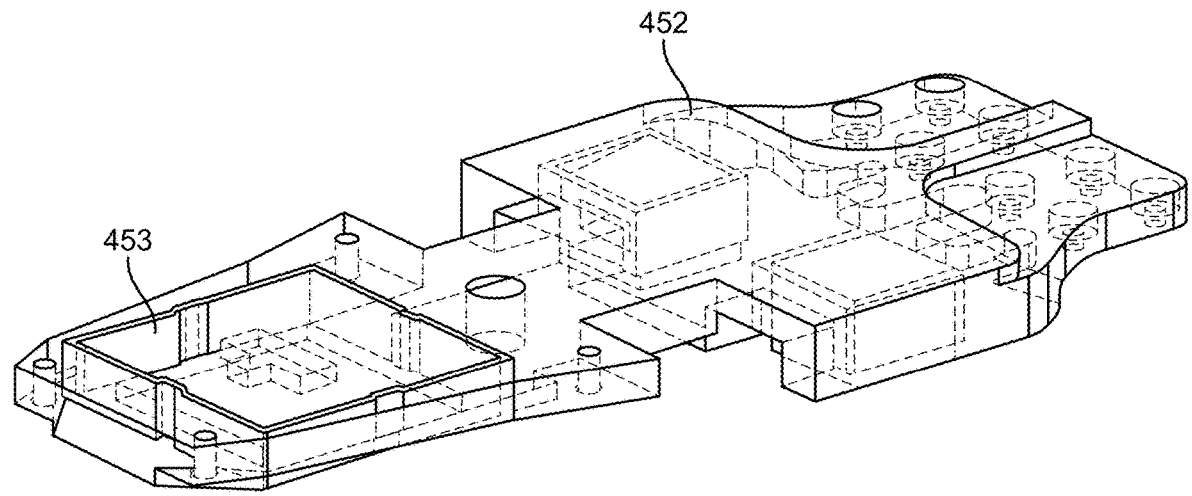
FIGS. 8A-8D show schematic illustrations of components of a reticle gripper, according to some embodiments.
Figure 8B:
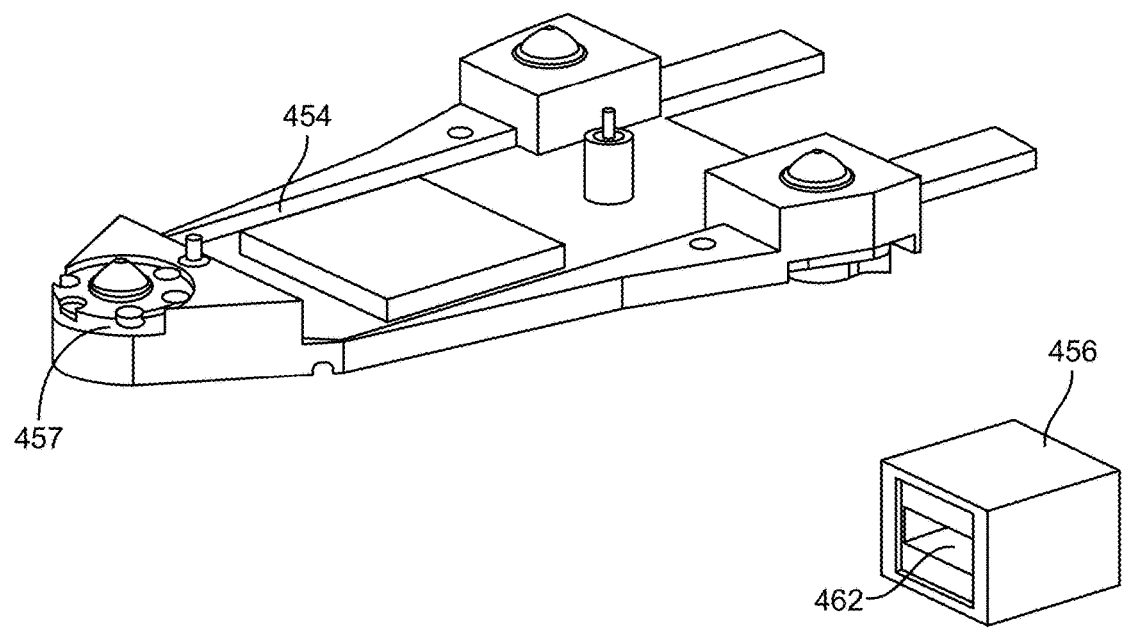

In some embodiments, reticle gripper 450 comprises a static structure 452 and an isolation structure 454. In particular, FIG. 8A illustrates static structure 452 of reticle gripper 450, whereas FIG. 8B illustrates isolation structure 454 of reticle gripper 450. In some embodiments, static structure 452 and isolation structure 454 may be referred to herein as static mass and isolation mass, respectively.

In some embodiments, static structure 452 may comprise a rigid structure that is formed by machining processes. In some embodiments, static structure 452 may be coupled to (e.g., bolted down to) the reticle handler arm 402. Static structure 452 may also be connected to a flexure structure 453. Flexure structure 453 may be referred to as a flexure mass and may comprise a flexible element that is designed to provide specific degrees of freedom to the system. In some embodiments, flexure structure 453 may move independently of static structure 452 at its own frequency.

In some embodiments, isolation structure 454 includes a strain gauge 457 and eddy current dampers 456, which may be housed in cube-shaped locations of the isolation structure 454. In some embodiments, strain gauge 457 may be referred to as a moving mass and may measure strain of the isolation structure 454.

In some embodiments, eddy current dampers 456 may comprise a cobalt iron alloy. An example eddy current damper 456 is shown separate from isolation structure 454 at the bottom of FIG. 8B for illustrative purposes. Each eddy current damper 456 may include magnets 462, which are housed or sealed in the dampers 456. The magnets 462 may enclose or surround a stainless steel conductor in order to provide damping effects. When there is a relative velocity or acceleration between the conductor and the magnets 462, an eddy current is induced such that the eddy current and magnetic fields impede the relative movement. In other words, when the conductors move inside the eddy current dampers 456, the change in magnetic field causes damping. Thus, an eddy current damping effect or force may be generated within the gripper damper.

In some embodiments, two eddy current dampers 456 may be utilized to provide damping effects, and each eddy current damper 456 may comprise dimensions of about 22 mm×22 mm×16.2 mm.

In some embodiments, isolation structure 454 may be designed to have a resonant frequency of about 7 Hz in the horizontal (X,Y) directions with greater than about 6% damping. In some embodiments, the isolation structure 454 may be designed as a flexure system with individual flexures with dimensions of about 22 mm×10 mm×0.170 mm. In some embodiments, the 0.170 mm thickness of the flexures may approach limits of current manufacturing technologies. Eddy current dampers may be selected as the damping elements of reticle gripper 450 in order to increase the thickness, apportion as much stiffness to the flexures as possible, and avoid issues related to creep. In some embodiments, horizontal reticle acceleration in the reticle handler may be reduced from 10.8 m/s$^2$ to 0.24 m/s$^2$. This reduction in acceleration may provide a margin of safety against slip of 1.8, in which the reticle is expected to slip for any value less than 1. In some embodiments, the passive isolation and damping system may allow robot handoff budgets and image blur specifications to be met.

Figure 8C:
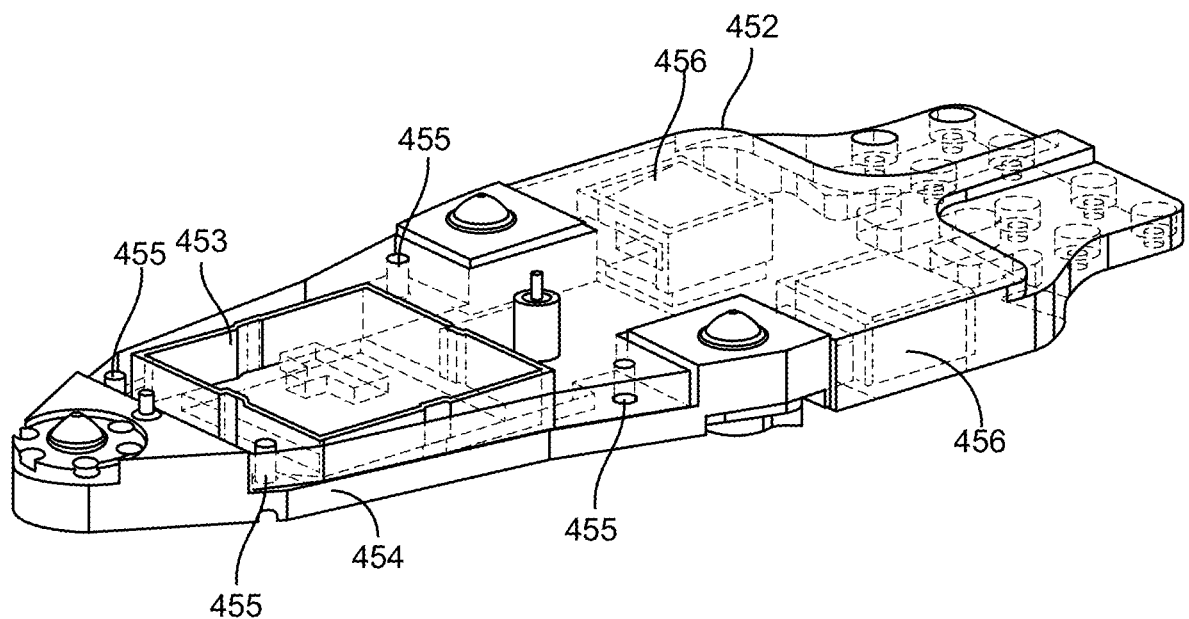
Figure 8D:
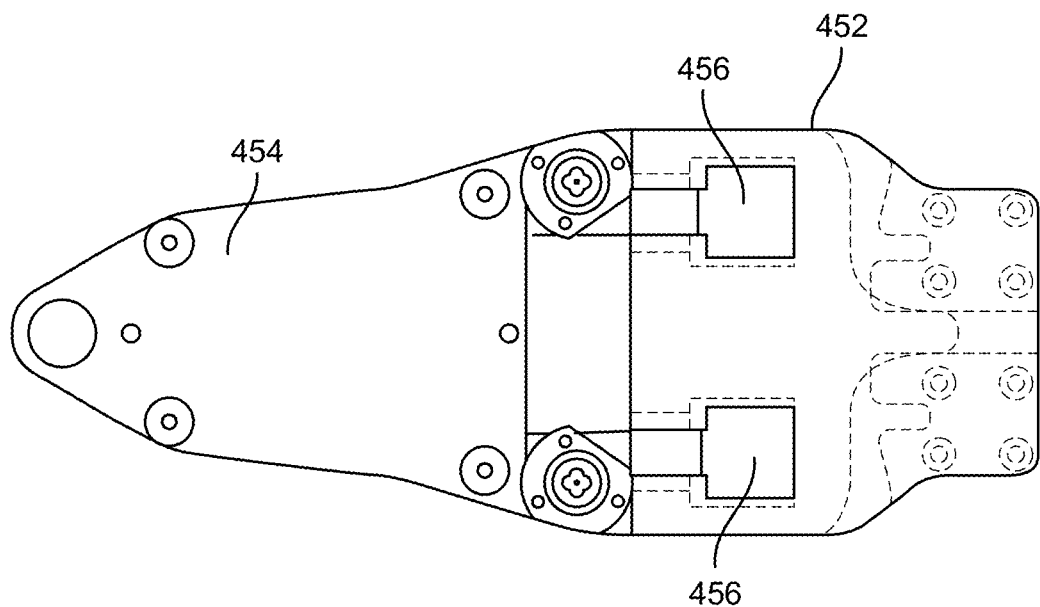

Static structure 452 and isolation structure 454 may be assembled together as shown in FIGS. 8C and 8D. In particular, FIG. 8C shows static structure 452 affixed to isolation structure 454, in which the flexure structure 453 fits on top of the square-shaped piece of the isolation structure 454. Static structure 452 and isolation structure 454 may be connected by a plurality of springs 455. Eddy current dampers 456 are also shown connected to corresponding portions of the static structure 452. In some embodiments, a plurality of springs may join the flexure structure 453 and the static structure 452 together. The frequency of the reticle gripper may depend on the mass and stiffness of the springs. FIG. 8D shows a bottom plan view of the assembled reticle gripper 450 with bot static structure 452 and isolation structure 454.

Figure 9:
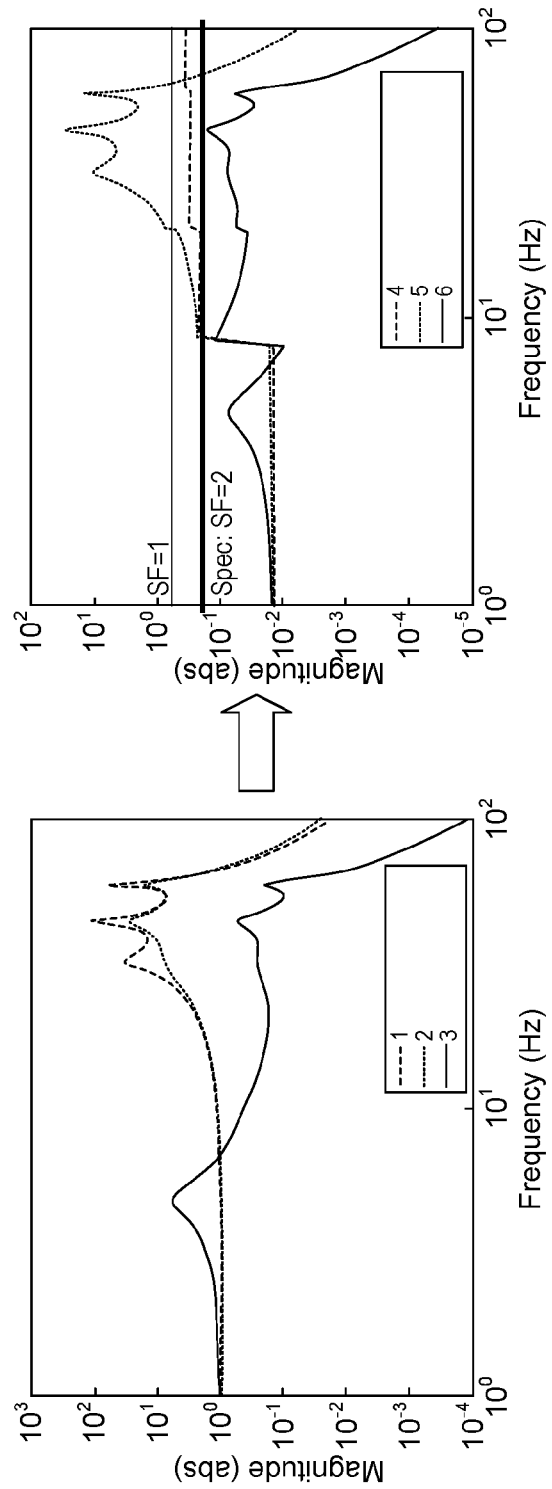
FIG. 9 show graphs of frequency response of the system with and without the damping and isolation system, according to some embodiments.

FIG. 9 shows graphs of frequency response of the system with and without the damping and isolation system, according to some embodiments. In particular, FIG. 9 illustrates two Bode plots that show the attenuation achieved by implementing the reticle gripper damper and isolation system. The Bode plots show lines 1-3 on the left and lines 4-6 on the right. In some embodiments, lines 1 and 4 show the frequency response of an undamped system, whereas lines 2-3 and 5-6 show the frequency response of the system with different levels of damping applied. In particular, lines 3 and 6 represent the frequency response with the reticle gripper damper and isolation system applied. In some embodiments, the Bode plots show that the undamped system has accelerations resulting from input disturbances (e.g., base frame (BF) disturbances) that cause three frequency spikes around about 30-60 Hz. By utilizing the reticle gripper damper and isolation system, the amplitudes of the frequencies are attenuated and are within desirable specifications for the system. In some embodiments, the Bode plot on the right side of FIG. 9 may include one or more lines indicating desirable specifications, such as a predetermined safety factor or a predetermined magnitude for a threshold against reticle slippage in the system. In some embodiments, the Bode plot on the left side of FIG. 9 also illustrates the response of a system utilizing tune mass dampers for illustrative purposes. The reticle gripper damper and isolation system ultimately provides significant attenuation of vibrations during reticle positioning and reticle handling operations by the reticle handler apparatus.

Example Method of Operation

Figure 10:
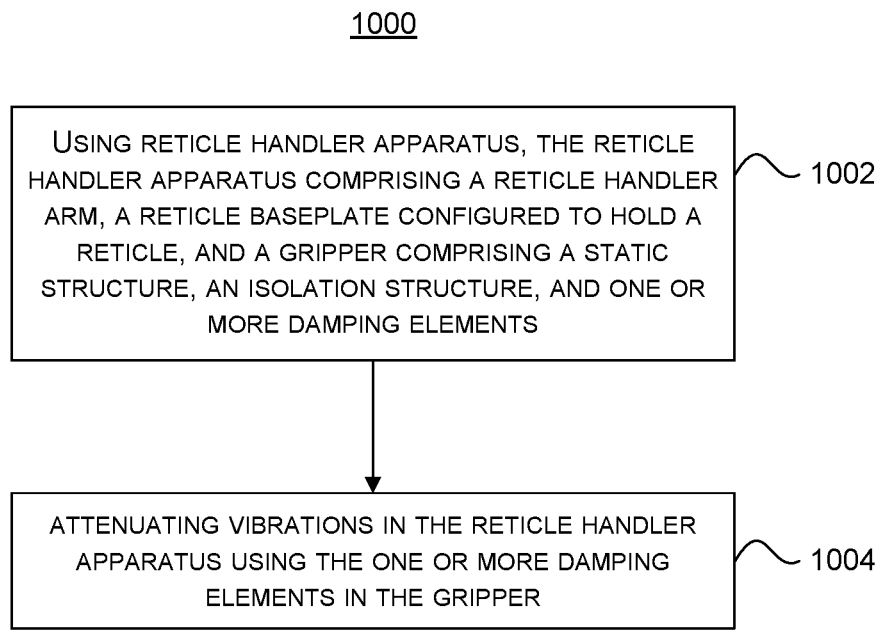
FIG. 10 is a schematic illustration of a flowchart for reducing vibrations in a reticle handler apparatus using a reticle gripper, according to some embodiments.

FIG. 10 is a flowchart of an exemplary method 1000 for reducing vibrations in a reticle handler apparatus using a reticle gripper, according to some embodiments. In some embodiments, method 1000 may describe passive isolation and damping in a reticle handler using a gripper, such the reticle handler 402 and gripper 450, as discussed above with reference to FIGS. 4-8D. It should be understood that the operations shown in method 1000 are not exhaustive and that other operations can be performed as well before, after, or between any of the illustrated operations. In various embodiments of the present disclosure, the operations of method 1000 can be performed in a different order and/or vary.

In operation 1002, a reticle handler apparatus may be used. The reticle handler apparatus includes a reticle handler arm, a reticle baseplate configured to hold a reticle, and a gripper comprising a static structure, an isolation structure, and one or more damping elements. In some embodiments, the one or more damping elements comprises eddy current dampers or viscoelastic dampers.

In operation 1004, vibrations in the reticle handler apparatus may be attenuated using the one or more damping elements in the gripper. In some embodiments, accelerations in the reticle handler apparatus using the isolation structure are damped. In some embodiments, the vibrations are attenuated during reticle positioning and reticle handling operations by the reticle handler apparatus. In some embodiments, the vibrations are attenuated by providing passive isolation and damping by using mass of the reticle, the isolation structure, and the reticle baseplate to provide an isolating structure for reducing the vibrations.

The embodiments may further be described using the following clauses:

1. A reticle handler apparatus for positioning of a reticle, the reticle handler apparatus comprising:
   a reticle handler arm;
   a reticle baseplate configured to hold the reticle; and
   a gripper arranged to connect the reticle baseplate to the reticle handler arm,
   wherein the gripper comprises:
      a static structure that is coupled to the reticle handler arm;
      an isolation structure that is coupled to the static structure; and
      one or more damping elements, and
   wherein the gripper is configured to reduce vibrations of the reticle in the reticle handler apparatus using the one or more damping elements.

2. The reticle handler apparatus of clause 1, wherein the one or more damping elements comprises eddy current dampers.

3. The reticle handler apparatus of clause 1, wherein the one or more damping elements comprises viscoelastic dampers.

4. The reticle handler apparatus of clause 1, wherein the static structure and isolation structure are connected together by a plurality of springs.

5. The reticle handler apparatus of clause 1, wherein the gripper is configured to provide passive isolation and damping by using mass of the reticle, the isolation structure, and the reticle baseplate to provide an isolating structure for reducing vibrations in the reticle.

6. The reticle handler apparatus of clause 1, wherein the isolation structure is configured to damp accelerations in the reticle handler apparatus 7. The reticle handler apparatus of clause 1, wherein the gripper is configured to attenuate vibrations during reticle positioning and reticle handling operations by the reticle handler apparatus.

8. A lithographic apparatus comprising:
   an illumination system configured to condition a radiation beam;
   a support structure constructed to support a patterning device, the patterning device being capable of imparting the radiation beam with a pattern in its cross-section to form a patterned radiation beam;
   a projection system configured to project the patterned radiation beam onto a target portion of a substrate, and
   a reticle handler apparatus configured to handle and position the patterning device, wherein the reticle handler apparatus comprises: a reticle handler arm, a reticle baseplate configured to hold the patterning device, and a gripper arranged to connect the reticle baseplate to the reticle handler arm,
   wherein the gripper comprises:
      a static structure that is coupled to the reticle handler arm;
      an isolation structure that is coupled to the static structure; and
      one or more damping elements,
      wherein the gripper is configured to reduce vibrations of the patterning device in the reticle handler apparatus using the one or more damping elements.

9. The lithographic apparatus of clause 8, wherein the one or more damping elements comprises eddy current dampers.

10. The lithographic apparatus of clause 8, wherein the one or more damping elements comprises viscoelastic dampers.

11. The lithographic apparatus of clause 8, wherein the gripper is configured to provide passive isolation and damping by using mass of the patterning device, the isolation structure, and the reticle baseplate to provide an isolating structure for reducing vibrations in the patterning device.

12. The lithographic apparatus of clause 8, wherein the isolation structure is configured to damp accelerations in the reticle handler apparatus.

13. The lithographic apparatus of clause 8, wherein the gripper is configured to attenuate vibrations during reticle positioning and reticle handling operations by the reticle handler apparatus.

14. The lithographic apparatus of clause 8, wherein the patterning device is a reticle.

15. A method of reducing vibrations in a reticle handler apparatus, the method comprising:
using a reticle handler apparatus, the reticle handler apparatus comprising a reticle handler arm, a reticle baseplate configured to hold a reticle, and a gripper comprising a static structure, an isolation structure, and one or more damping elements; and
attenuating vibrations in the reticle handler apparatus using the one or more damping elements in the gripper.

16. The method of clause 15, wherein the one or more damping elements comprises eddy current dampers.

17. The method of clause 15, wherein the one or more damping elements comprises viscoelastic dampers.

18. The method of clause 15, wherein attenuating the vibrations comprises: providing passive isolation and damping by using mass of the reticle, the isolation structure, and the reticle baseplate to provide an isolating structure for reducing the vibrations.

19. The method of clause 15, further comprising:
damping accelerations in the reticle handler apparatus using the isolation structure.

20. The method of clause 15, wherein attenuating the vibrations comprises:
attenuating the vibrations during reticle positioning and reticle handling operations by the reticle handler apparatus.

Although specific reference may be made in this text to a "reticle," it should be understood that this is just one example of a patterning device and that the embodiments described herein may be applicable to any type of patterning device. Additionally, the embodiments described herein may be used to provide safety support for any object to ensure a clamping failure does not cause the object to fall and damage either itself or other equipment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that the disclosure can be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

The invention claimed is:

1. A reticle handler apparatus for positioning of a reticle, the reticle handler apparatus comprising:
   a reticle handler arm;
   a reticle baseplate configured to hold the reticle; and
   a gripper arranged to connect the reticle baseplate to the reticle handler arm,
   wherein the gripper comprises:
      a static structure that is coupled to the reticle handler arm;
      an isolation structure that is coupled to the static structure; and
      one or more damping elements, at least one of the one or more damping elements being located within an internal volume of the static structure and/or isolation structure, and
   wherein the gripper is configured to reduce vibrations of the reticle in the reticle handler apparatus using the one or more damping elements.

2. The reticle handler apparatus of claim 1, wherein the one or more damping elements comprises eddy current dampers.

3. The reticle handler apparatus of claim 1, wherein the one or more damping elements comprises viscoelastic dampers.

4. The reticle handler apparatus of claim 1, wherein the static structure and isolation structure are connected together by a plurality of springs.

5. The reticle handler apparatus of claim 1, wherein the gripper is configured to provide passive isolation and damping by using mass of the reticle, the isolation structure, and the reticle baseplate to provide an isolating structure for reducing vibrations in the reticle.

6. The reticle handler apparatus of claim 1, wherein the isolation structure is configured to damp accelerations in the reticle handler apparatus.

7. The reticle handler apparatus of claim 1, wherein the gripper is configured to attenuate vibrations during reticle positioning and reticle handling operations by the reticle handler apparatus.

8. A lithographic apparatus comprising:
   an illumination system configured to condition a radiation beam;
   a support structure constructed to support a patterning device, the patterning device being capable of imparting the radiation beam with a pattern in its cross-section to form a patterned radiation beam;
   a projection system configured to project the patterned radiation beam onto a target portion of a substrate, and
   a reticle handler apparatus configured to handle and position the patterning device, wherein the reticle handler apparatus comprises: a reticle handler arm, a reticle baseplate configured to hold the patterning device, and a gripper arranged to connect the reticle baseplate to the reticle handler arm,
   wherein the gripper comprises:
      a static structure that is coupled to the reticle handler arm;
      an isolation structure that is coupled to the static structure; and
      one or more damping elements, at least one of the one or more dampening elements being located within an internal volume of the static structure and/or isolation structure,
      wherein the gripper is configured to reduce vibrations of the patterning device in the reticle handler apparatus using the one or more damping elements.

9. The lithographic apparatus of claim 8, wherein the one or more damping elements comprises eddy current dampers.

10. The lithographic apparatus of claim 8, wherein the one or more damping elements comprises viscoelastic dampers.

11. The lithographic apparatus of claim 8, wherein the gripper is configured to provide passive isolation and damping by using mass of the patterning device, the isolation structure, and the reticle baseplate to provide an isolating structure for reducing vibrations in the patterning device.

12. The lithographic apparatus of claim 8, wherein the isolation structure is configured to damp accelerations in the reticle handler apparatus.

13. The lithographic apparatus of claim 8, wherein the gripper is configured to attenuate vibrations during reticle positioning and reticle handling operations by the reticle handler apparatus.

14. The lithographic apparatus of claim 8, wherein the patterning device is a reticle.

15. A method of reducing vibrations in a reticle handler apparatus, the method comprising:
   using a reticle handler apparatus, the reticle handler apparatus comprising a reticle handler arm, a reticle baseplate configured to hold a reticle, and a gripper comprising a static structure, an isolation structure, and one or more damping elements, wherein at least one of the one or more dampening elements is located within an internal volume of the static structure and/or the isolation structure; and
   attenuating vibrations in the reticle handler apparatus using the one or more damping elements in the gripper.

16. The method of claim 15, wherein the one or more damping elements comprises eddy current dampers.

17. The method of claim 15, wherein the one or more damping elements comprises viscoelastic dampers.

18. The method of claim 15, wherein attenuating the vibrations comprises: providing passive isolation and damping by using mass of the reticle, the isolation structure, and the reticle baseplate to provide an isolating structure for reducing the vibrations.

19. The method of claim 15, further comprising:
   damping accelerations in the reticle handler apparatus using the isolation structure.

20. The method of claim 15, wherein attenuating the vibrations comprises:
   attenuating the vibrations during reticle positioning and reticle handling operations by the reticle handler apparatus.

* * * * *